United States Patent [19]

Gyursanszky

[11] 4,167,696

[45] Sep. 11, 1979

[54] ZERO PHASE SWITCHING FOR MULTI-PHASE SYSTEMS

[75] Inventor: Zoltan L. Gyursanszky, Don Mills, Canada

[73] Assignee: Honeywell Inc., Minneapolis, Minn.

[21] Appl. No.: 844,095

[22] Filed: Oct. 20, 1977

[30] Foreign Application Priority Data

Nov. 2, 1976 [CA] Canada .................................. 264654

[51] Int. Cl.² ............................................... G05F 3/00
[52] U.S. Cl. ................................ 323/18; 307/252 UA
[58] Field of Search ........... 307/252 UA; 323/18 ZW

[56] References Cited

U.S. PATENT DOCUMENTS

| | | | |
|---|---|---|---|
| 3,497,796 | 2/1970 | Konrad | 323/24 |
| 3,671,849 | 6/1972 | Kingston | 323/ZS |
| 3,764,890 | 10/1973 | Caen | 307/252 UA X |
| 3,958,172 | 5/1976 | Beck | 307/252 UA X |

Primary Examiner—William M. Shoop
Attorney, Agent, or Firm—Trevor B. Joike

[57] ABSTRACT

A multi-phase, zero phase control apparatus is disclosed having switches for controlling the application of power from a multi-phase source to a load and a control apparatus for energizing the switches to conduct current to the load beginning at the zero point in the current cycle, wherein the control apparatus has a synchronization network to insure that the control apparatus is synchronized to the line current regardless of the conductive states of the switches.

18 Claims, 13 Drawing Figures

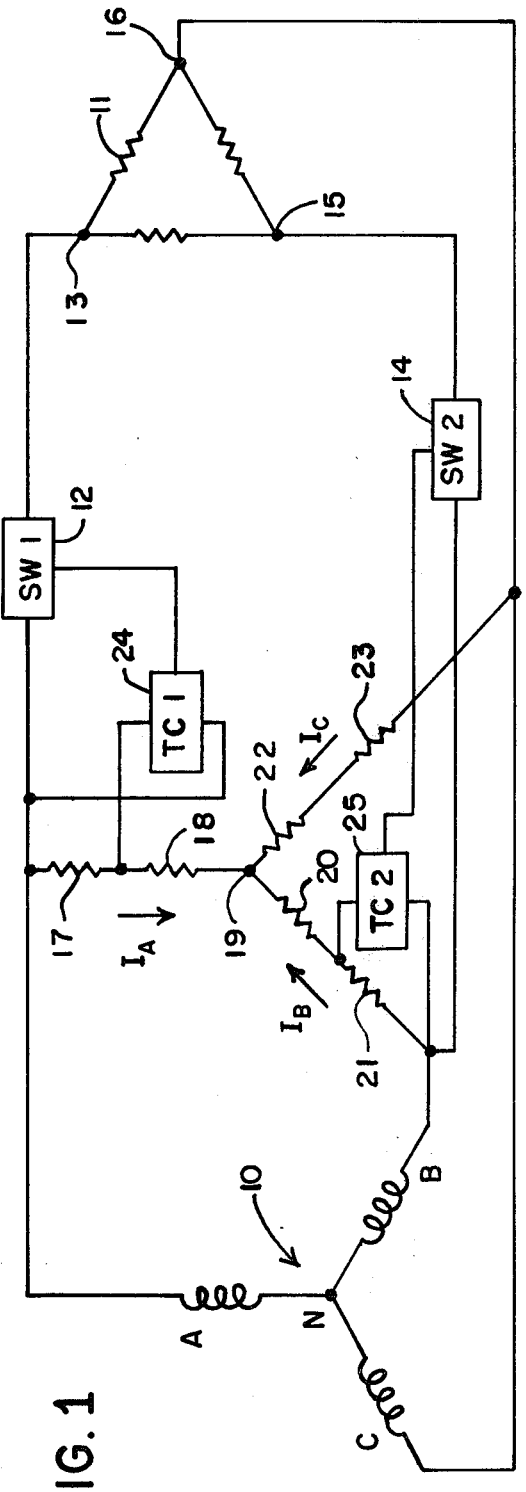
FIG. 1
FIG. 3
FIG. 2

ZERO PHASE SWITCHING FOR MULTI-PHASE SYSTEMS

BACKGROUND OF THE INVENTION

The gating on or closing of switches at the zero point in the current cycle of the current supplied between a source and a load is known in the prior art. Indeed, zero phase switching of multi-phase systems, particularly three phase systems, is also known in the prior art. The prior art, however, has had a great deal of difficulty in gating on or closing the load controlling switches at the substantially zero point in the current cycle.

The first difficulty is usually due to the fact that such zero phase switching circuits are designed for pure resistive loads; but in practice all resistive loads, and most of the main sources, have minimal inductance. This inductance results in a difference in the phase angles between the voltage and the current supplied by the source to the load through the switches. The second difficulty of typical prior art three phase switching systems is that they are synchronized to their respective line to neutral voltages which are in phase with the line currents during the on cycle. However, at the beginning of every on cycle, the switch, in three phase systems, which turns on first will see a line to line load only and its current will, therefore, be out of phase from the line to neutral voltage resulting in phase firing, rather than zero phase firing, and consequential radio frequency interference. The control problem when the voltage and current are out of phase is that the switches will be turned on or closed quite likely at a point in the current cycle other than the zero point which will result in the generation of radio frequency interference.

Furthermore, when solid state switches are used to control the supply of current from a source to a load, protective circuits must be devised to protect the solid state switches from damaging over voltages and dv/dt transients.

SUMMARY OF THE INVENTION

The present invention utilizes a synchronization network to control trigger circuits which turn on the switches at substantially the zero point in the current cycle. This synchronization network is arranged to be responsive to current which is in phase with the line current supplied to the load. The synchronization network will, therefore, insure that the trigger circuits will turn on or close their respective line switches at substantially the zero point in the line current cycle, and, therefore, substantially preclude the generation of radio frequency interference.

BRIEF DESCRIPTION OF THE DRAWINGS

These and other features and advantages will become apparent from a detailed review of the invention taken in conjunction with the drawings in which:

FIG. 1 is a schematic diagram of a prior art synchronization network;

FIG. 2 shows the electromotive vector diagram relating to FIG. 1;

FIG. 3 shows the voltage vector diagram of the apparatus shown in FIG. 1;

DETAILED DESCRIPTION OF THE INVENTION

Figure 4:
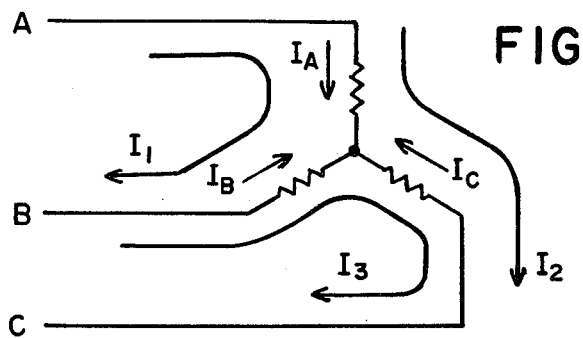
FIG. 4 shows the assumed current flows in the synchronization network useful in the mathematical analysis of the arrangement shown in FIG. 1.

In FIG. 1, a three phase, Y-connected secondary winding 10 of a three phase source transformer (the primary not being shown) is connected to a delta connected resistive load 11. Phase A of the secondary winding 10 is connected through switch 12, which may be a solid state switch such as a Triac or inversely connected parallel SCRs, to the junction 13 of delta connected load 11. Phase B is connected through switch 14 to the junction 15 of delta connected load 11 and phase C is directly connected to the junction 16 of the delta connected load. A synchronization network is comprised of resistors 17 and 18 series connected between the phase A line and common junction 19. Series connected resistors 20 and 21 are connected between common junction 19 and phase B and series resistors 22 and 23 are connected between common junction 19 and phase C. A trigger control circuit 24 is connected across resistor 17 and is also connected to switch 12 to control the turn on or closing of that switch. Also, a trigger control circuit 25 is connected across resistor 21 and to the switch 14 for controlling the turn on or closing of that switch.

FIG. 2 shows the electromotive vectors, line to line and line to neutral, for the transformer or generator the secondary winding 10 of which is shown in FIG. 1. As is conventional in three phase systems, the line to neutral electromotive vectors are 120° apart and the line to line electromotive vectors are also 120° apart. The voltage vectors are shown in FIG. 3. By convention, the voltage vectors are shown in the opposite direction of the electromotive vectors.

FIG. 4 is a shorthand representation of the Y-connected synchronization resistor network shown in FIG. 1. The currents are assumed to be in the direction shown. The currents $I_1$, $I_2$ and $I_3$ are the phase currents whereas the currents $I_A$, $I_B$ and $I_C$ are the currents through each separate leg of the Y-connected resistor synchronization network. The problem is to determine the phase of the currents $I_A$, $I_B$ and $I_C$ since these are the currents that are being sensed by the triggering networks to gate on or close the switches in the lines.

Current $I_A$ is equal to the sum of current $I_1$ and $I_2$ as shown by convention in FIG. 4. The current $I_1$, which is shown flowing from phase A to phase B, will therefore be directly out of phase with the phase B to phase A voltage vector shown in FIG. 3. Similarly, the current $I_2$ which flows between phase A and phase C will be directly in phase with the voltage vector of the voltage from phase A to phase C shown in FIG. 3. Therefore, current $I_A$ can be shown by the following expression:

$$I_A = I_1 + I_2 = K_1 - 150° + K_1 + 150° = K_2 + 180° \quad (1)$$

where $K_1$ and $K_2$ are assumed current magnitudes.

Similarly, currents $I_B$ and $I_C$ can be shown by the following expressions:

$$I_B = I_3 - I_1 = K_1 + 90° - K_1 - 150° = K_2 + 60° \quad (2)$$

and $$I_C = -I_3 - I_2 = -K_1 + 90° - K_1 + 150° = K_2 - 60° \quad (3)$$

Figure 5:
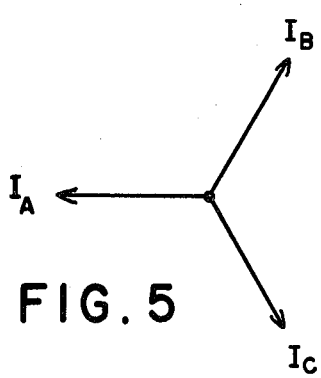
FIG. 5 is a vector diagram of the current shown in FIG. 4.
Figure 6:
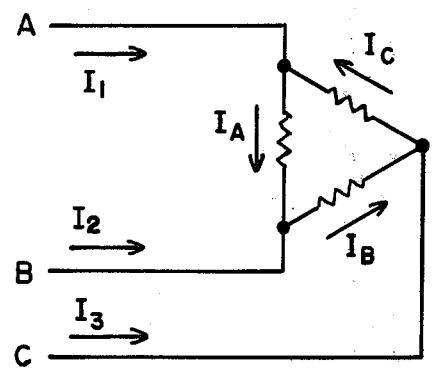
FIG. 6 shows the assumed current flows in the load shown in FIG. 1.

FIG. 5 shows the vector diagram for the currents $I_A$, $I_B$ and $I_C$. As can be seen, these currents are in phase with the line to neutral voltages. FIG. 6 shows a delta connected load and the assumed currents flowing therethrough. The problem here is to determine the phase angle of the line currents $I_1$, $I_2$ and $I_3$. According to the assumed directions of current flows shown in FIG. 6, $I_1$ is equal to the difference between $I_A$ and $I_C$. $I_A$, according to the direction of flow shown, will be directly out of phase with the phase B to phase A voltage vector shown in FIG. 3. Moreover, current $I_C$ will be directly out of phase with the phase A to phase C voltage vector also shown in FIG. 3. Therefore, current $I_1$ can be shown by the following expression:

$$I_1 = I_A - I_C = M_1 - 150° - M_1 - 130° = M_2 180° \quad (4)$$

Currents $I_2$ and $I_3$ can similarly be expressed by the following equations:

$$I_2 = I_B - I_A = M_1 + 90° - M_1 - 150° = M_2 + 60°, \quad (5)$$

and $$I_3 = I_C - I_B = M_1 - 30° - M_1 + 90° = M_2 - 60°. \quad (6)$$

Figure 7:
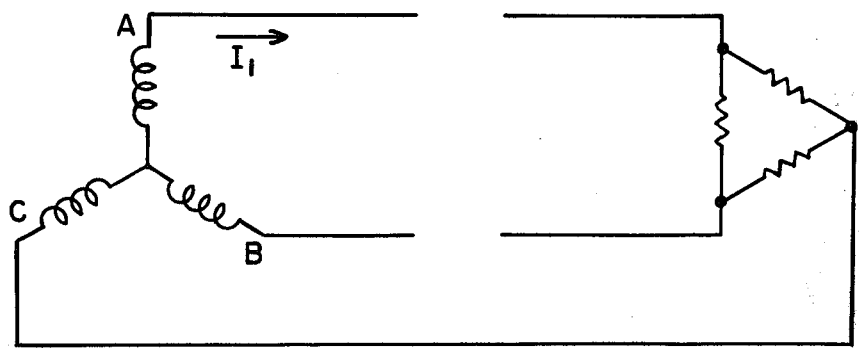
FIG. 7 shows the condition where one of the switches of FIG. 1 is on and one of the switches is off.

As can be seen, the phase angles of the line currents $I_1$, $I_2$ and $I_3$ are directly in phase with the currents $I_A$, $I_B$ and $I_C$ flowing through the synchronization network shown in FIG. 1 which currents are used by the trigger control circuits to fire or close the switches at the zero point in the current cycle. Since these line currents are in phase with the synchronization currents, the switches will indeed be gated on at the substantial zero point in the current cycle. However, the analysis so far has assumed that both switches shown in FIG. 1 have been receiving gating signals. FIG. 7 assumes that switch 12 shown in FIG. 1 is conductive but switch 14 is not conductive at a time when current is to be supplied to the load.

FIG. 7, assuming the switch 12 is the first switch to be turned at the beginning of the "on" cycle, shows the current which switch 12 will see upon conduction. This current is in phase with the phase A to phase C voltage vector shown in FIG. 3. Thus, the current $I_1$ will have a phase angle of $+150°$. However, the current $I_A$ shown in FIG. 1 which is used by the trigger circuit 24 to determine the zero point in the current cycle at which to turn on or close switch 12 has a phase angle of $+180°$ as shown by equation 1. These two currents are, therefore, 30° out of phase. Thus, the first solid state switch to be turned on, in the assumption above the solid state switch 12, will not be turned on at the zero point in the current cycle and RFI will result.

Figure 8:
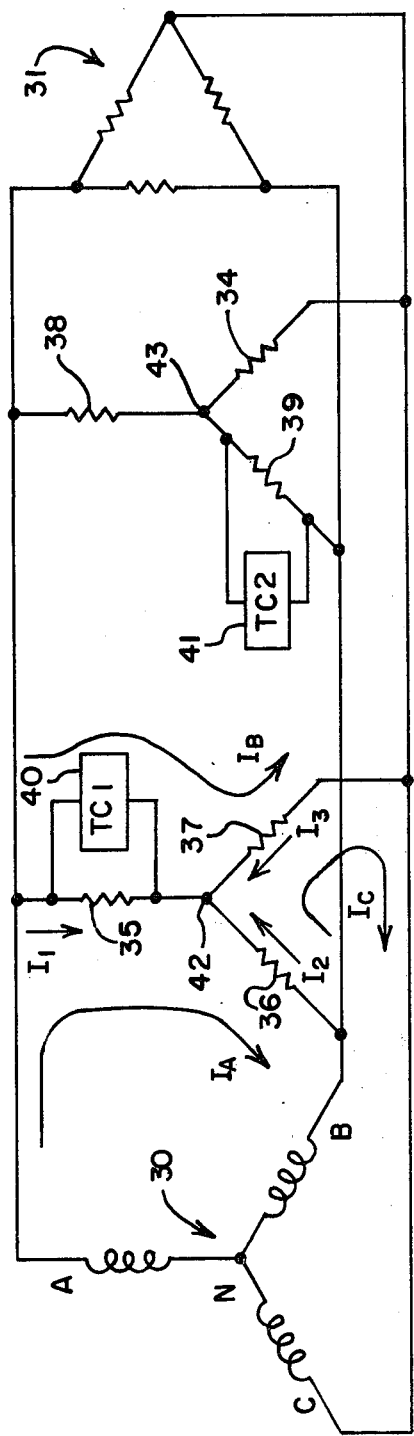
FIG. 8 shows a redrawn version of the synchronization network according to the invention shown in FIG. 11 which is useful for analyzing the synchronization network according to the invention.
Figure 11:
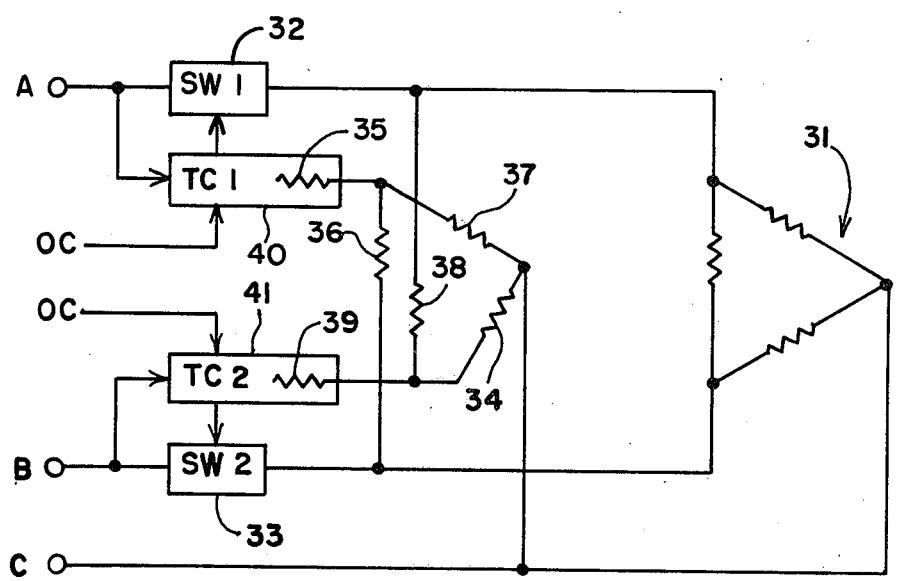
FIG. 11 shows the synchronization network according to the invention.

FIG. 8 is a redrawn version of the invention shown in FIG. 11 suitable to mathematically analyze the instant invention. The Y-connected three phase secondary 30 has its A phase connected to delta connected load 31 through switch 32 (FIG. 11), its B phase connected to load 31 through switch 33 (FIG. 11) and its C phase directly connected to the delta connected load 31. Synchronization resistor 35 is connected between phase A and common junction 42, synchronization resistor 36 is connected between phase B and junction 42, and synchronization resistor 37 is connected between phase C and common junction 42. Trigger circuit 40, connected across resistor 35, is used to control the turning on or closing of switch 32. In addition, synchronization resistor 38 is connected between phase A and a common junction 43, resistor 39 is connected between phase B and common junction 43 and synchronization resistor 34 is connected between phase C and common junction 43. Trigger control circuit 41, connected across resistor 39, is used to control the turning on or closing of switch 33. The current flows, necessary to analyze the synchronization network according to the invention, are assumed in the direction shown.

The problem here is to determine the phase angle of the currents $I_1$, $I_2$ and $I_3$ which currents are utilized by the trigger control circuits to control the turning on or closing the line switches. Current $I_1$ is equal to the sum of the currents $I_A$ and $I_B$. The current $I_A$ has a phase angle which is directly opposite the phase B to phase A voltage vector shown in FIG. 3 and the current $I_B$ is directly in phase with the voltage vector representing the voltage from phase A to phase C shown in FIG. 3. Therefore, the current $I_1$ can be shown by the following equation:

$$I_1 = I_A + I_B = P_1 - 150° + P_1 + 150° = P_2 + 180° \quad (7)$$

where $P_1$ and $P_2$ are assumed current magnitudes.

The currents $I_2$ and $I_3$ can likewise be shown by the following equations:

$$I_2 = I_C - I_A = P_1 + 90° - P_1 - 150° = P_2 + 60° \quad (8)$$

and $$I_3 = -I_B - I_C = -P_1 + 150° - P_2 + 90° = P_2 - 60° \quad (9)$$

Just as in the case of FIG. 1, the sensing currents in FIG. 8 are the same as the currents that the switches 32 and 33 experience during the "on" cycle. The description so far has assumed that the switches 32 and 33 shown in FIG. 11 are on. However, the problem with the circuit shown in FIG. 1 arises prior to the "on" cycle.

Figure 9:
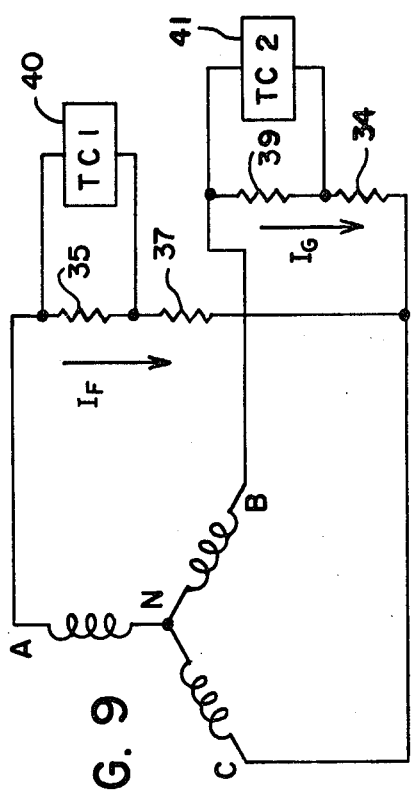
FIG. 9 shows the assumed current flows used in the mathematical analysis of the arrangement shown in FIG. 8.

FIG. 9 shows the circuit of FIG. 11 just prior to the "on" cycle with both switches 32 and 33 off.

The current $I_F$, which triggering circuit 40 will use to determine the zero point in the current cycle that the switch 32 will experience upon turn on is directly in phase with the phase A to phase C voltage vector as shown in FIG. 3. Thus, $I_F$ can be determined by the following equation:

$$I_F = Q + 150°\quad(10)$$

where Q is the magnitude of the current $I_F$.

Similarly, $I_G$ is in phase with the line B to line C voltage which is directly opposite to the line C to line B voltage vector shown in FIG. 3 and thus may be given by the following expression:

$$I_G = Q + 90°.\quad(11)$$

The first solid state switch to conduct will, upon conduction, see a line to line phase angle in the current passing therethrough. Thus, for example, switch 32 will see a line A to line C voltage having a phase angle of +150° and the current $I_F$, which is used by the switch 32 trigger circuit 40 to determine the turn on of switch 32, will also have a phase angle of +150° and thus the trigger circuit 40 will turn on switch 32 at the zero point in the current cycle unlike the apparatus shown in FIG. 1.

Figure 10:
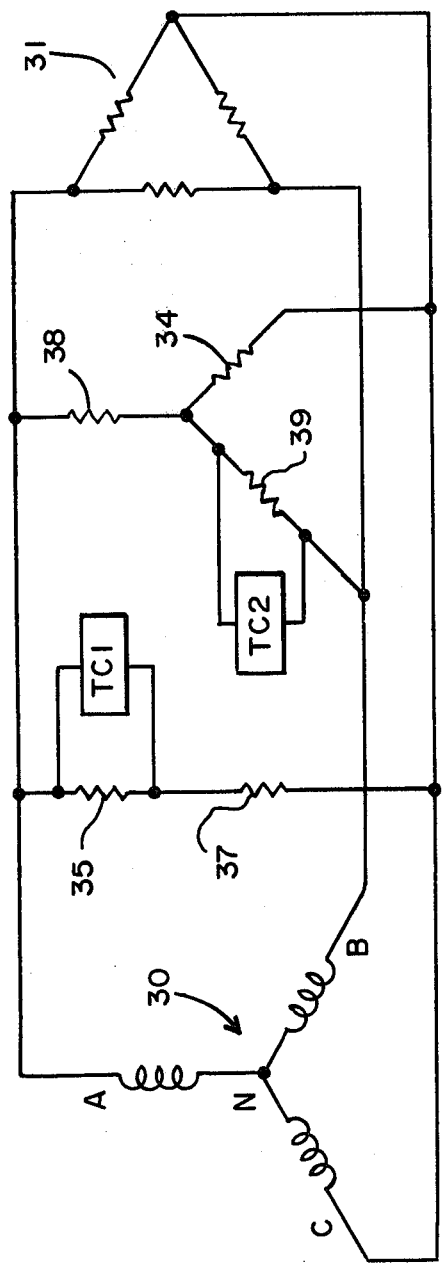
FIG. 10 shows the arrangement of FIG. 8 with switch 1 on and switch 2 off.

Assuming that switch 32 has been turned on but switch 33 remains off, the synchronization network takes the form shown in FIG. 10. Since the switch 33, upon conduction, will experience a current flow therethrough having a phase angle of +60° as given by equation 5 and since the triggering circuit 41 will experience a current flow having a phase angle of +60° as given by equation 8, the switch 33 will be gated on at the zero point in the current cycle of the current passing through it.

Thus, the synchronization network according to the invention shown in FIG. 11 insures that the line switches will be turned on at the zero point in the current cycle regardless of the conductive state of the line switches. Although the description so far has shown the use of two switches for controlling the energization of the load, a third switch may be included in the phase C line for controlling the line C current.

The input to the triggering circuits 40 and 41 are supplied by a signal labelled OC. Such signals may, for example, be supplied by a time proportioning circuit such as that shown in FIG. 12.

Figure 12:
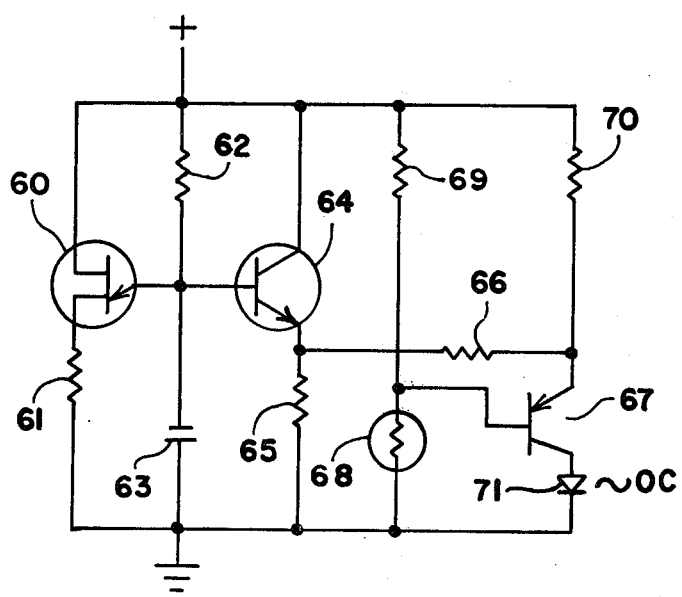
FIG. 12 shows a temperature responsive time proportioning circuit useful in association with the invention; and, FIG. 13 is a detailed schematic of one triggering circuit used in FIG. 11.

The circuit in FIG. 12 comprises a relaxation oscillator formed by unijunction transistor 60 having base 1 connected to a positive source and a base 2 connected to ground through resistor 61. The emitter of unijunction transistor 60 is coupled to the junction of resistor 62 which is connected to the positive source and capacitor 63 which is connected to ground. This circuit supplies a sawtooth wave form to transistor 64 which has its emitter connected through resistor 65 to ground, its collector connected to the positive source and its base connected to the junction of resistor 62 and capacitor 63. The junction of the emitter of transistor 64 and resistor 65 will, therefore, see the sawtooth wave form generated by the relaxation oscillator. This sawtooth wave form is supplied through a resistor 66 to the emitter of transistor 67 the base of which is connected to ground through a temperature sensing resistor 68 and is also connected to the postive source through resistor 69. The emitter of this transistor 67 is connected to the positive source through resistor 70. The collector of transistor 67 is connected to ground through light emitting diode 71. If the sawtooth wave form supplied through resistor 66 to the emitter of transistor 67 remains below the voltage on the base of transistor 67 as determined by temperature sensing device 68, transistor 67 will not be turned on and the light emitting diode 71 will not be energized. However, should the temperature sensed by temperature sensing device 68 change to decrease the voltage on the base to transistor 67, the LED 71 will be energized for so much of the sawtooth wave form cycle as will be above the voltage established by the temperature sensing device 68. Thus, the length of time that the light emitting diode 71 is turned on will be determined by the sawtooth wave form generated by the transistor 64 and the level of voltage applied to the base of transistor 67 by temperature sensing device 68. This time will vary depending upon the temperature sensed by temperature sensing device 68.

Figure 13:
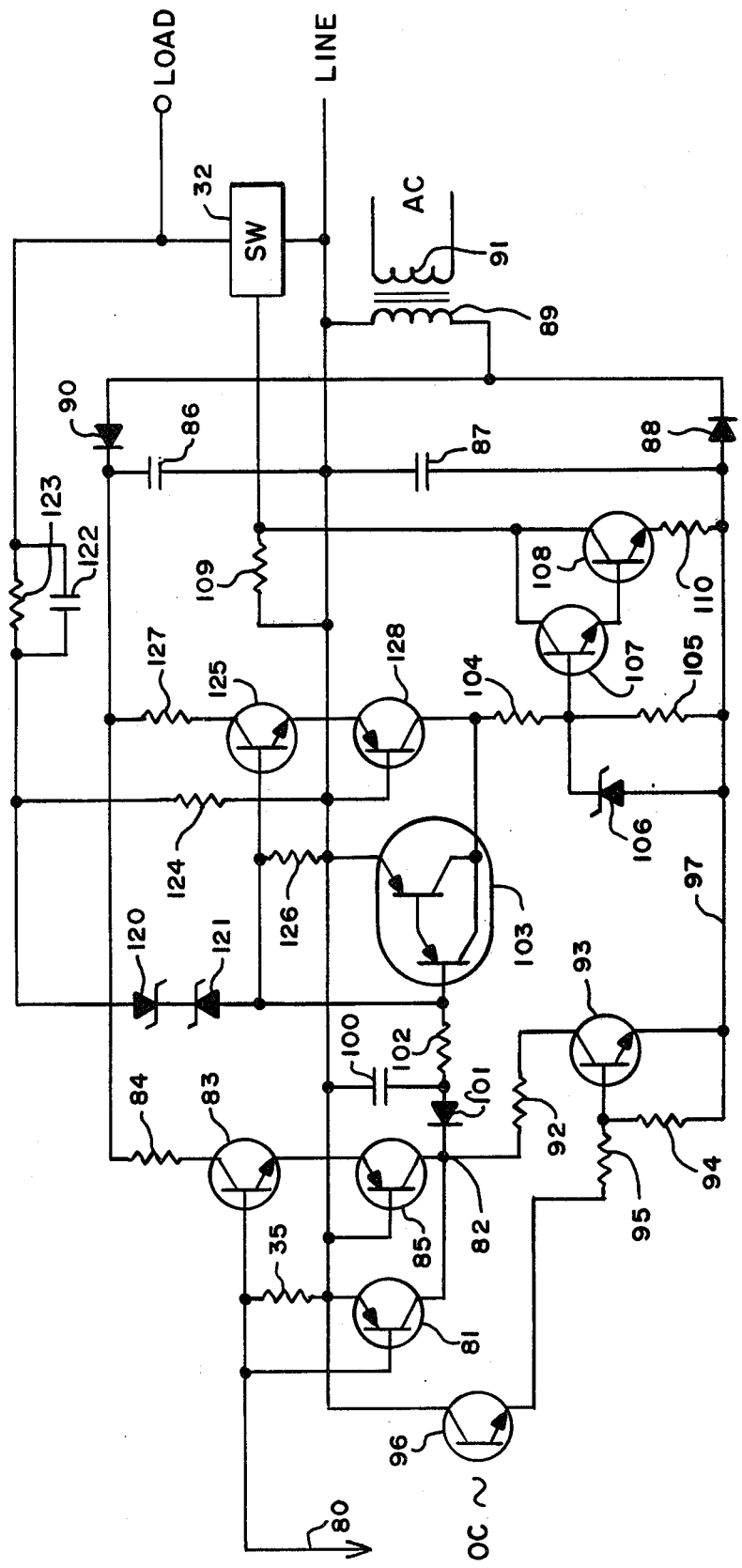

FIG. 13 shows a detailed schematic diagram of one of the trigger circuits shown in FIG. 11. Assuming that the detailed schematic shown in FIG. 13 represents the triggering circuit 40 shown in FIG. 11, the line 80, which goes to the synchronization network comprising resistors 34, 36, 37 and 38 and particularly to the junction of resistors 36 and 37 shown in FIG. 11, is also connected at its other end to one side of resistor 35 the other side of which is connected to the phase A line. Transistor 81 has its base connected to line 80, its emitter connected to the phase A line and its collector connected to junction 82. Transistor 83 has its base connected to line 80, its collector connected to a positive source through resistor 84 and its emitter connected to the emitter of transistor 85. The base of transistor 85 is connected to the phase A line and its collector is connected to junction 82. The positive source is generated by a capacitor 86 connected on its one side to the resistor 84 and on its other side to the phase A line. Capacitor 87 is connected on one side to the phase A line and on the other side through diode 88 to one side of secondary winding 89. The junction of capacitor 86 and resistor 84 is connected through another diode 90 to the one side of the secondary 89. The other side of secondary 89 is connected to the phase A line. The primary winding 91 supplies AC to the secondary winding which, across capacitors 86 and 87, establishes positive potential for the transistors shown in FIG. 13.

Junction 82 is connected through resistor 92 to the collector of transistor 93 the emitter of which is connected to line 97 and then to the other side of capacitor 87. The emitter of transistor 93 is also connected to its base by a resistor 94 and the base of transistor 93 is connected through a resistor 95 to the emitter of a photo responsive transistor 96 the collector of which is connected to the phase A line. The photo transistor 96 receives its energization from the light emitting diode 71 shown in FIG. 12. Capacitor 100 has one side connected to the phase A line and its other side connected through diode 101 to junction 82. Assuming the current in phase A line is at zero, transistors 81, 82 and 83 will be off. As the current swings positively it will establish a voltage across resistor 35 which will, after a very few degrees into the current cycle, cause transistor 81 to turn on effectively shorting capacitor 100. Similarly, as the current on the phase A line swings negatively, it establishes a voltage across resistor 35 which will turn on transistors 83 and 85 after a very few degrees into the current cycle again effectively shorting capacitor 100 through the emitter base-diode of transistor 81, the base-emitter diode of transistor 83 and the emitter to collector circuit of transistor 85. Therefore, transistors 81, 83 and 85 will be off only during a short portion of the current cycle around the zero point. Capacitor 100 is allowed to charge only during the off times of transistors 81, 83 and 85, but capacitor 100 cannot charge at all if transistor 93 is not turned on. Therefore, capacitor 100 can only charge when transistors 81, 83 and 85 are off, during the zero point in the current cycle, and when transistor 96 has received energization from light emitting diode 71 to turn on transistor 93. Should transistor 93 turn on at a non-zero point in the current cycle, capacitor 100 is effectively shorted and cannot charge.

The junction of capacitor 100 and diode 101 is connected through resistor 102 to the base of a Darlington transistor pair 103 which has its emitter connected to the phase A line and its collector connected to line 97 through resistors 104 and 105. The junction of resistors 104 and 105 is connected through zener diode 106 to line 97 and is also connected to the base of transistor 107 the collector of which is connected to the collector of transistor 108 and to the junction of resistor 109, the other side of which is connected to the phase A line, and the gate or control element of switch 32. The emitter of transistor 107 is connected to the base of transistor 108 and the emitter of transistor 108 is connected to line 97 through resistor 110. When capacitor 100 charges, it turns on the Darlington transistor pair 103 which turns on transistors 107 and 108 to supply a gating or turn on signal to the gate or control element of switch 32, which switch may take the form of inverse parallel SCR's or a Triac. Thus, the switch 32 can only be turned on into conduction at the zero point in the cycle when the light emitting diode 71 is generating its signal OC. The operation results regardless of whether the current cycle is entering its positive half cycle or its negative half cycle.

To protect the switch 32, when it is a solid state switch, from overvoltages or from voltages which have a destructive or damaging rate of rise, overvoltage and dv/dt sensing has been included. Thus, the base of Darlington pair 103 is connected through reversely series connected zener diodes 120 and 121 the other side of which is connected to the load side of switch 32 through the parallel combination of capacitor 122 and resistor 123. The junction of this parallel combination and the series connected zener diodes is connected through resistor 124 to the phase A line. The junction of the base of Darlington pair 103 and the series connected zener diodes is connected to the base of transistor 125 and is also connected through resistor 126 to the phase A line. The collector of transistor 125 is connected through resistor 127 to the junction of resistor 84 and capacitor 86 and the emitter of this transistor is connected to the emitter of transistor 128 which has its collector connected to the junction of resistor 104 and the collector of Darlington pair 103. The base of transistor 128 is connected to the phase A line.

Resistors 123 and 124 essentially form a voltage divider across the switch 32. When the voltage across the switch 32 is excessive, one or the other of the zener diodes 120 and 121, depending on whether the current cycle is in its positive or negative half cycle, will break down to energize the appropriate transistors 103 or 125 and 128. Thus, the switch 32 is turned on to protect it from destructive or damaging overvoltages. At the same time, if the rate of rise of the voltage across the switch 32 is too large, capacitor 122 essentially shorts out resistor 123 and the appropriate diode 120 or 121 will break down to gate on the switch 32 to protect it from the destructive or damaging rate of rise of the voltage thereacross.

Thus, the synchronization circuit allows the switches in a multi-phase or three phase system to be turned on at the zero point in the current cycle regardless of which ones, if any, of the switches are conducting at the time. Furthermore, the solid state switches, if used, in the system, are protected against overvoltage and destructive damaging rate of rise conditions.

The embodiments of the invention in which an exclusive property or right is claimed are defined as follows:

1. A multi-phase, zero phase control apparatus comprising:

supply terminal means for the supply of multi-phase power;

load terminal means for connection to a load;

multi-line connecting means for connecting said supply terminal means to said load means, said multi-line connecting means having at least first and second switch means in respective first and second lines of said multi-line connecting means; and, first and second switch control means for energizing said first and second switch means respectively to conduct current, beginning at substantially the zero point in the current cycle, to the load means, said first and second switch control means having synchronization means connected between said multi-line connecting means and said first and second switch control means to insure that said first and second switch control means are synchronized to the current supplied to said load terminal means regardless of the conductive state of said first and second switch means.

2. The apparatus of claim 1 wherein said first switch control means comprises a first resistor connected between said synchronization means and said first line, a first transistor having an emitter and a base connected across said first resistor and a collector, said emitter being connected to said first line, a second transistor having a base connected to said base of said first transistor, a collector and an emitter, a third transistor having a base connected to said first line, an emitter connected to the emitter of said second transistor and a collector connected to the collector of said first transistor, means connecting said collectors of said second and third transistors across a source of direct current potential, a capacitor, means connecting said capacitor across said base and collector of said third transistor and across said source of direct current potential, and a gating circuit connected to said capacitor of said first switch means for turning on said first switch means at substantially the zero point in the current cycle of the current controlled by said first switch means.

3. The apparatus of claim 1 wherein said synchronization means comprises a delta connected resistive network connected between said multi-line connecting means and said first and second switch control means.

4. The apparatus of claim 1 wherein said supply terminal means comprises at least first, second and third supply terminals, said load terminal means comprises at least first, second and third load terminals, said multi-line connecting means comprising at least first and second conductors and third conductor means, said first switch means being in said first conductor for connecting said first supply terminal to said first load terminal, said second switch means being in said second conductor for connecting said second supply terminal to said second load terminal and said third conductor means connecting said third supply terminal to said third load terminal.

5. The apparatus of claim 4 wherein said synchronization means comprises a delta connected resistive network.

6. The apparatus of claim 5 wherein said delta connected resistive network comprises a first resistor connected from said first switch control means to a junction between said second switch means and said second load terminal, a second resistor connected from said second switch control means to a junction between said first switch means and said first load terminal, a third resistor connected from a junction of said first resistor and said first switch control means to said third conductor means and a fourth resistor connected from a junction of said second resistor and said second switch control means to said third conductor means.

7. The apparatus of claim 6 wherein said first switch control means comprises a fifth resistor connected between said first resistor and said first conductor, a first transistor having an emitter and a base connected across said fifth resistor and a collector, said emitter being connected to said first conductor, a second transistor having a base connected to said base of said first transistor, a collector and an emitter, a third transistor having a base connected to said first conductor, an emitter connected to the emitter of said second transistor and a collector connected to the collector of said first transistor, means connecting said collectors of said second and third transistors across a source of direct current potential, a capacitor, means connecting said capacitor across said base and collector of said third transistor and across said source of direct current potential, and a gating circuit connected to said capacitor and said first switch means for turning on said first switch means at substantially the zero point in the current cycle of the current controlled by said first switch means.

8. The apparatus of claim 6 wherein said first switch control means comprises a first switch control means resistor connected from said first connector to said first resistor, a first gating circuit connected to said first switch means and a first zero sensing circuit connected between said first switch control means resistor and said first gating circuit, and said second switch control means comprises a second switch control means resistor connected to said second resistor, a second gating circuit connected to said second switch means and a second zero sensing circuit connected between said second switch control means resistor and said second gating circuit.

9. The apparatus of claim 8 wherein said first zero sensing means comprises a first zero sensor for sensing the zero point in the current cycle of the current through said first switch control means resistor and a first time proportioning condition responsive means for insuring that the first switch means will not be turned on until both the zero point in the current cycle of the current in the first conductor has been substantially attained and a time proportioning signal from said first time proportioning condition responsive means has been received and the second zero sensing means comprises a second zero sensor for sensing the zero point in the current cycle of the current through said second switch control means resistor and a second time proportioning condition responsive means for insuring that the second switch means will not be turned on until both the zero point in the current cycle of the current in the second conductor has been substantially attained and a time proportioning signal from said second time proportioning condition responsive means has been received.

10. The apparatus of claim 9 wherein said first and second switch means comprises respective first and second solid state switches having respective first and second gates connected to said respective first and second gating circuits.

11. A three phase, zero phase control apparatus comprising:
first, second and third supply terminals for the supply of three phase power;
first, second and third load terminals for connection to a three phase load;
first connecting means for connecting said first supply terminal to said first load terminal, second connecting means for connecting said second supply terminal to said second load terminal, and third connecting means for connecting said third supply terminal to said third load terminal, at least said first and second connecting means having respective first and second switch means therein; and,
first and second switch control means for energizing said first and second switch means to conduct current, beginning at the zero point of the current cycle, to the load means, said first and second switch control means having synchronization means connected between said first, second and third connecting means and said first and second switch control means to insure that the first and second switch control means are synchronized to the current supplied to said first, second and third load terminals regardless of the conductive state of said first and second switch means.

12. The apparatus of claim 11 wherein said first switch control means comprises a first resistor connected between said synchronization means and said first line, a first transistor having an emitter and a base connected across said first resistor and a collector, said emitter being connected to said first line, a second transistor having a base connected to said base of said first transistor, a collector and an emitter, a third transistor having a base connected to said first line, an emitter connected to the emitter of said second transistor and a collector connected to the collector of said first transistor, means connecting said collectors of said second and third transistors across a source of direct current potential, a capacitor, means connecting said capacitor across said base and collector of said third transistor and across said source of direct current potential, and a gating circuit connected to said capacitor of said first switch means for turning on said first switch means at substantially the zero point in the current cycle of the current controlled by said first switch means.

13. The apparatus of claim 11 wherein said synchronization means comprises a delta connected resistive network connected between said first, second and third connecting means and said first and second switch control means.

14. The apparatus of claim 13 wherein said delta connected resistive network comprises a first resistor connected from said first switch control means to a junction between said second switch means and said second load terminal, a second resistor connected from said second switch control means to a junction between said first switch means and said first load terminal, a third resistor connected from a junction of said first resistor and said first switch control means to said third connecting means, and a fourth resistor connecting a junction of said second resistor and said second switch control means to said third connecting means.

15. The apparatus of claim 14 wherein said first switch control means comprises a first resistor connected between said fifth resistor and said first conductor, a first transistor having an emitter and a base connected across said fifth resistor and a collector, said emitter being connected to said first conductor, a second transistor having a base connected to said base of said first transistor, a collector and an emitter, a third transistor having a base connected to said first conductor, an emitter connected to the emitter of said second transistor and a collector connected to the collector of said first transistor, means connecting said collectors of said second and third transistors across a source of direct current potential, a capacitor, means connecting said capacitor across said base and collector of said third transistor and across said source of direct current potential, and a gating circuit connected to said capacitor and said first switch means for turning on said first switch means at substantially the zero point in the current cycle of the current controlled by said first switch means.

16. The apparatus of claim 14 wherein said first switch control means comprises a first switch control means resistor connected from said first connecting means to said first resistor, a first gating circuit connected to said first switch means and a first zero sensing circuit connected between said first switch control means resistor and said first gating circuit, and said second switch control means comprises a second switch control means resistor connected to said second resistor, a second gating circuit connected to said second switch means and a second zero sensing circuit connected between said second switch control means resistor and said second gating circuit.

17. The apparatus of claim 16 wherein said first zero sensing means comprises a first zero sensor for sensing the zero point in the current cycle of the current through said first switch control means resistor and a first time proportioning condition responsive means for insuring that the first switch means will not be turned on until both the zero point in the current cycle of the current in the first connecting means has been substantially attained and a time proportioning signal from said first time proportioning condition responsive means has been received and the second zero sensing means comprises a second zero sensor for sensing the zero point in the current cycle of the current through said second switch control means resistor and a second time proportioning condition responsive means for insuring that the second switch means will not be turned on until both of the zero point in the current cycle of the current in the second connecting means has been substantially attained and a time proportioning signal from said second time proportioning condition responsive means has been received.

18. The apparatus of claim 17 wherein said first and second switch means comprises respective first and second solid state switches having respective first and second gates connected to said respective first and second gating circuits.

* * * * *